United States Patent [19]

Takeuchi

[11] Patent Number: 5,343,097
[45] Date of Patent: Aug. 30, 1994

[54] PHASE COMPARATOR CIRCUIT AND PHASE LOCKED LOOP (PLL) CIRCUIT USING THE SAME

[75] Inventor: Hiroshi Takeuchi, Tokyo, Japan
[73] Assignee: NEC Corporation, Tokyo, Japan
[21] Appl. No.: 944,415
[22] Filed: Sep. 14, 1992
[30] Foreign Application Priority Data
  Sep. 13, 1991 [JP] Japan .................. 3-234210
[51] Int. Cl.⁵ .................. H03K 5/26; H03L 7/00
[52] U.S. Cl. .................. 307/514; 307/516; 328/133
[58] Field of Search .......... 307/494, 510, 514, 516, 307/525, 528; 328/114, 133

[56] References Cited
U.S. PATENT DOCUMENTS

| | | | |
|---|---|---|---|
| 3,970,868 | 7/1976 | Clements et al. | 307/516 |
| 4,006,423 | 2/1977 | Kuniyoshi et al. | 307/516 |
| 4,614,911 | 9/1986 | Kawano | 307/516 X |
| 4,629,914 | 12/1986 | Okanobu | 307/510 |
| 5,039,889 | 8/1991 | Janta et al. | 307/514 |

*Primary Examiner*—Willis R. Wolfe
*Attorney, Agent, or Firm*—Sughrue, Mion, Zinn, Macpeak & Seas

[57] ABSTRACT

A phase comparator circuit is constituted by a quadrant multiplier circuit and a DC compensation circuit. The quadrant multiplier circuit includes transistor pairs and outputs phase differences respectively of input data signals and clock signals. The DC compensation circuit has a variable current source and two transistor pairs whose collectors are connected respectively to a positive phase output and a reverse phase output from said quadrant multiplier circuit and whose emitters are connected to said variable current source. The phase comparator circuit thus arranged is capable of increasing a pulling-in range of the circuit.

6 Claims, 3 Drawing Sheets

PHASE COMPARATOR CIRCUIT AND PHASE LOCKED LOOP (PLL) CIRCUIT USING THE SAME

BACKGROUND OF THE INVENTION

1. Field of the Invention

The present invention relates to a phase comparator circuit, and more particularly to a multiplying-type phase comparator circuit having a large pull-in range.

2. Description of the Related Art

A conventional phase comparator circuit which is employed in a phase locked loop circuit (hereinafter referred to as "PLL circuit") and to which the present invention relates is shown in FIG. 1. The conventional phase comparator circuit shown in FIG. 1 is a quadrant multiplier circuit which comprises a constant-current source 11, a pair of collector resistors R1, R2 and a plurality of NPN bipolar transistors Q1, Q4, Q5, Q8–Q10. Each of the three pairs of transistors Q1, Q4; Q5, Q8; and Q9, Q10 constitutes an emitter-coupled differential circuit. Reference numerals 14 and 15 denote clock signal input terminals for receiving clock signals ($\overline{CLK}$, CLK) from a voltage control oscillator (hereinafter referred to as "VCO"). Reference numerals 16 and 17 denote data input terminals for receiving data signals (DATA, $\overline{DATA}$). A reference numeral 18 denotes an output terminal.

The function of the above circuit is explained hereunder with reference to FIG. 2 which shows a transfer characteristic thereof. Input signals $V_1(t)$ are applied to the bases of the transistors Q9 and Q10, respectively, through the data input terminals 16, 17, whereby the distribution of bias currents to these two transistors Q9, Q10 is controlled. When high level outputs from the VCO are applied to the two cross-coupled transistor pairs Q1, Q4 and Q5, Q8, these transistor pairs function as two sets of single-pole double-throw switches which are driven in accordance with the input signals from the VCO.

Consequently, the relation between the DC output voltage "Vd" outputted at the output terminal 18 and the phase difference "$\phi$" is such that, as shown by a graph of transfer characteristics in FIG. 2, the output voltage Vd is at its minimum when $\phi = 0, 2\pi$, the same is 0 when $\phi = \pi/2, 3/2\pi$, and the same is at its maximum when $\phi = \pi$.

The conventional phase comparator circuit described above has the following defects. Since the circuit detects only a phase difference between the input signals $V_1(t)$ and the outputs from the VCO, in the case where the frequency of the input signals $V_1(t)$ and that of the VCO outputs are different from each other, the phase differences therebetween continues to circulate between 0 and $2\pi$ and, thus, the output voltage Vd of the phase comparator circuit repeatedly changes between a positive output and a negative output, which leads to the possibility that no DC components may appear. For this reason, the PLL circuit employing such conventional phase comparator circuit 19 may face a problem in that, when the frequency of the input signals $V_1(t)$ and that of the VCO outputs are different from each other, the control voltage for the VCO cannot be controlled by the output voltage of the phase comparator circuit, resulting in the failure of the desired synchronization. This is a problem to be solved by the invention, in the conventional phase comparator circuit.

SUMMARY OF THE INVENTION

It is, therefore, an object of the invention to overcome the problems in the conventional phase comparator circuit and to provide an improved phase comparator circuit which ensures the controlling of the control voltage for the voltage control oscillator (VCO).

According to one aspect of the present invention, there is provided a phase comparator circuit comprising:

an output terminal, data input terminals for receiving input data signals, and clock input terminals for receiving clock signals;

a quadrant multiplier circuit which outputs at its positive phase and negative phase output nodes, respectively, phase differences between the input data signals and the clock signals; and a DC compensation circuit having a variable current source and two pairs of transistors whose collectors are connected to the positive phase and negative phase output nodes, respectively, of the quadrant multiplier circuit, whose emitters are commonly grounded through the variable current source, and whose bases are connected to the clock input terminals, respectively.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Now, a preferred embodiment of a phase comparator circuit according to the invention will be explained with reference to the accompanying drawings.

Figure 1:
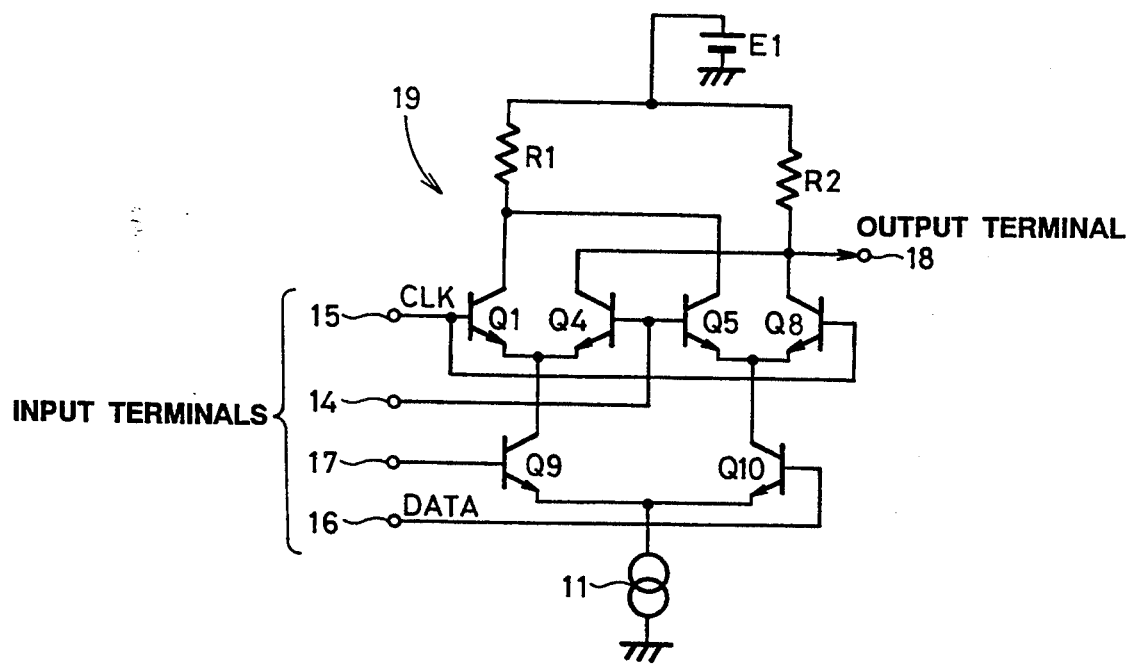
FIG. 1 is a circuit diagram of a conventional phase comparator circuit.
Figure 2:
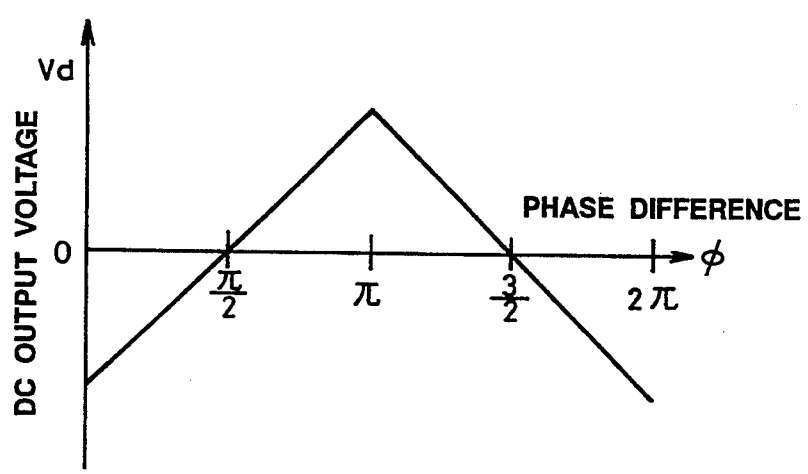
FIG. 2 is a graph showing transfer characteristics of the conventional circuit shown in FIG. 1.
Figure 3:
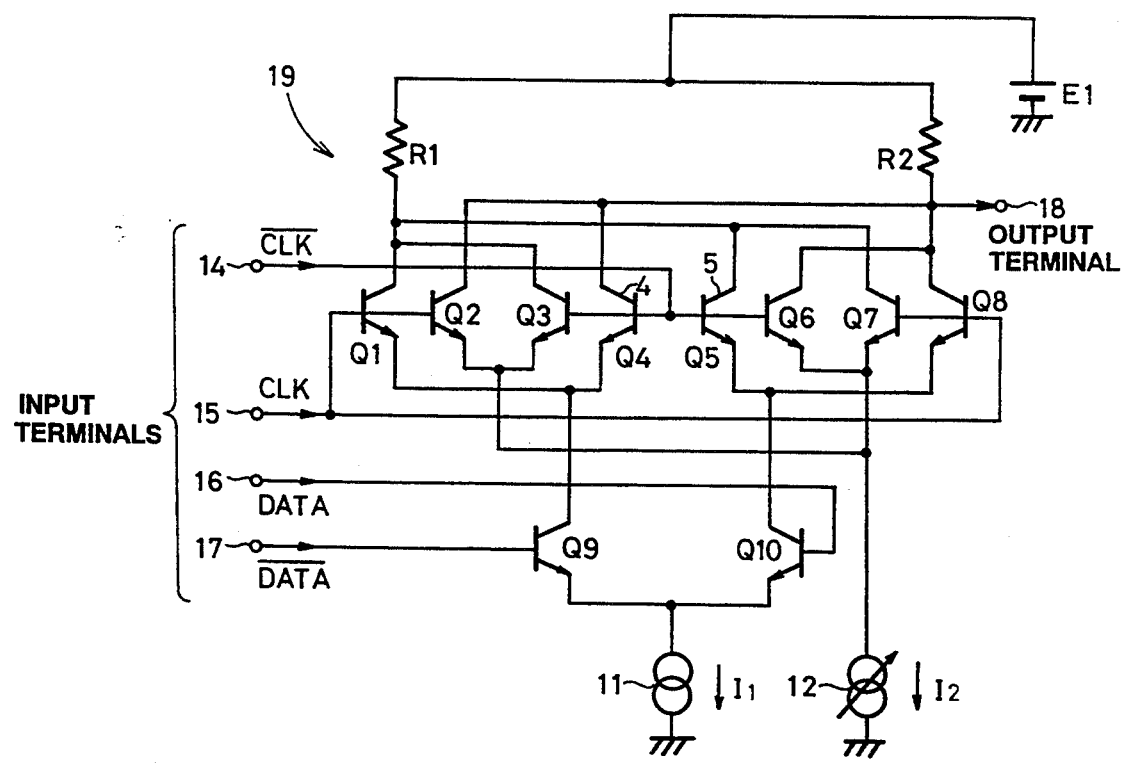
FIG. 3 is a circuit diagram of a phase comparator circuit of an embodiment according to the invention.

FIG. 3 diagrammatically shows a phase comparator circuit of an embodiment according to the invention. This circuit is constituted by two circuits, one circuit being a quadrant multiplier circuit having, as in the conventional circuit, a plurality of NPN bipolar transistors Q1, Q4, Q5, Q8, Q9 and Q10, a constant-current source 11, two collector resistors R1 and R2, input terminals 14–17 and an output terminal 18, and the other circuit being a DC compensation circuit having a plurality of NPN bipolar transistors Q2, Q3, Q6 and Q7 and a variable current source 12.

More specifically, in the DC compensation circuit, each pair of the transistors Q2, Q3 and Q6, Q7 constitutes an emitter-coupled differential circuit. The collectors of each pair of the transistors Q2, Q3 and Q6, Q7 are connected to positive phase and negative phase output nodes, respectively, of the quadrant multiplier circuit, the bases thereof are connected to the clock signal input terminals, and the common emitters thereof are connected to ground (GND) through the variable current source 12.

Figure 4:
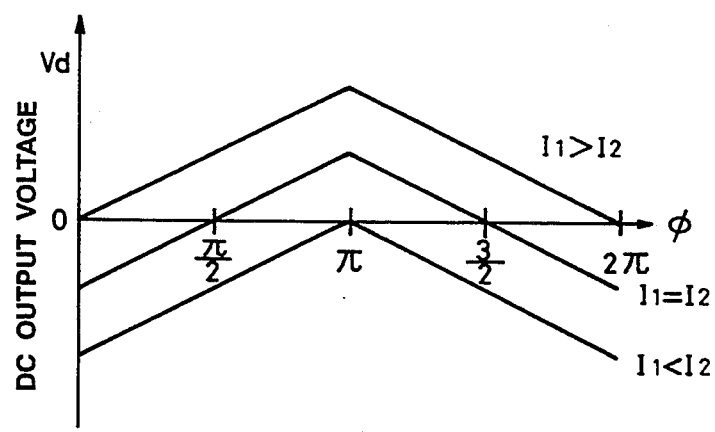
FIG. 4 is a graph showing the transfer characteristics of the circuit shown in FIG. 3.

Now, the operation of the above circuit is explained with reference to FIG. 4 which shows a graph of the transfer characteristics. It is assumed here that the current of the constant-current source 11 is $I_1$ and that of the variable current source 12 is $I_2$.

1) Consideration is given under the condition that the state where $I_1 = I_2$ is taken as a reference. It is assumed that the output voltage Vd when the phase difference $\phi$ is $\phi = \pi/2$ and $3/2\pi$ is relatively zero (0).

2) When $I_1 > I_2$, the average values of the currents which flow to the collector resistors R1 and R2 become smaller than when $I_1 = I_2$, so that the operation point of the circuit becomes higher and, therefore, the transfer characteristics shift upwardly.

3) When $I_1 < I_2$, the average values of the currents which flow to the collector resistors R1 and R2 become larger than when $I_1 = I_2$, so that the operation point of the circuit becomes lower and, therefore, the transfer characteristics shift downwardly.

In the circuit of the present invention as arranged above, it is possible to control the offset of the transfer characteristics by controlling the current values $I_2$ of the variable current source 12.

Figure 5:
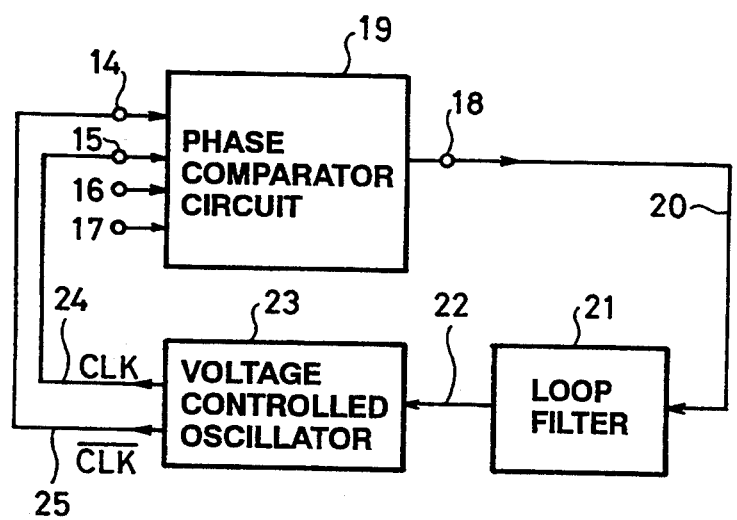
FIG. 5 is a block diagram of a phase locked loop (PLL) circuit to which the phase comparator circuit of the invention shown in FIG. 4 is embodied.

Next, FIG. 5 shows, in a block diagram, an arrangement in which the phase comparator circuit of FIG. 3 is applied to the PLL circuit. As shown therein, the PLL circuit is constituted by the phase comparator circuit 19 according to the invention, a loop filter 21 such as a low filter, and a voltage control oscillator (VCO) 23.

When the frequency of the input signals (DATA, $\overline{\text{DATA}}$) applied to the data input terminal 16, 17 and the oscillation frequency (frequency of clock signals CLK, $\overline{\text{CLK}}$) of the VCO 23 are markedly different from each other, the output voltage at the output terminal 18 becomes Vd=0 under the reference state where the current $I_1$ equals the current $I_2$, so that it cannot control the VCO 23. However, by controlling the current value $I_2$ of the variable current source 12, the offset of the transfer characteristics is adjusted and the VCO 23 is controlled so that the difference between the frequency of the data signals and the frequency of the clock signals is adjusted to be within the pulling-in range of the PLL circuit. Then, it is possible to ensure the synchronization of the PLL circuit.

As explained above, according to the invention, by adjusting the offset value of the output voltage of the phase comparator circuit, it is possible to obtain from the phase comparator circuit the output voltage that always controls the VCO, which is effective in increasing the pulling-in range of the circuit.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A phase comparator circuit comprising:
   an output terminal, data input terminals for receiving input data signals, and clock input terminals for receiving clock signals;
   a quadrant multiplier circuit which outputs at its positive phase and negative phase output nodes, respectively, phase differences between said input data signals and said clock signals; and
   a DC compensation circuit having a variable current source and two pairs of transistors whose collectors are connected to said positive phase and negative phase output nodes, respectively, of said quadrant multiplier circuit, whose emitters are commonly grounded through said variable current source, and whose bases are connected to said clock input terminals, respectively.

2. A phase comparator circuit comprising:
   an output terminal, data input terminals for receiving input data signals, and clock input terminals for receiving clock signals;
   a quadrant multiplier circuit which outputs at its positive phase and negative phase output nodes, respectively, phase differences between said input data signals and said clock signals; and
   a DC compensation circuit having a variable current source and two pairs of transistors whose collectors are connected to said positive phase and negative phase output nodes, respectively, of said quadrant multiplier circuit, whose emitters are commonly grounded through said variable current source, and whose bases are connected to said clock input terminals, respectively, and
   wherein said quadrant multiplier circuit comprises:
   a constant-current source;
   a first and a second load resistor;
   a first pair of transistors whose bases are connected to said data input terminals, respectively, and whose emitters are commonly grounded through said constant-current source;
   a second pair of transistors whose bases are connected to said clock input terminals, whose collectors are connected to a power source through said first and second load resistors, respectively, and whose emitters are commonly connected to a collector of one of said first pair of transistors; and
   a third pair of transistors whose bases are connected to said clock input terminals, whose collectors are connected to the power source through said first and second load resistors, respectively, and whose emitters are commonly connected to a collector of the other one of said first pair of transistors.

3. A phase comparator circuit comprising:
   an output terminal, data input terminals for receiving input data signals, and clock input terminals for receiving clock signals;
   a quadrant multiplier circuit which outputs at its positive phase and negative phase output nodes, respectively, phase differences between said input data signals and said clock signals; and
   a DC compensation circuit having a variable current source and two pairs of NPN bipolar transistors whose collectors are connected to said positive phase and negative phase output nodes, respectively, of said quadrant multiplier circuit, whose emitters are commonly grounded through said variable current source, and whose bases are connected to said clock input terminals, respectively.

4. A phase comparator circuit according to claim 2, in which said first to third pairs of transistors of said quadrant multiplier circuit are all NPN bipolar transistors.

5. A phase locked loop (PLL) circuit comprising:
   a phase comparator circuit including an output terminal; data input terminals for receiving input data signals; clock input terminals for receiving clock signals; a quadrant multiplier circuit which outputs at its positive phase and negative phase output nodes, respectively, phase differences between said input data signals and said clock signals; and a DC compensation circuit having a variable current source and two pairs of transistors whose collectors are connected to said positive phase and negative phase output nodes, respectively, of said quadrant multiplier circuit, whose emitters are commonly grounded through said variable current source, and whose bases are connected to said clock input terminals, respectively;

a loop filter for smoothing an output signal appearing at said output terminal of said phase comparator circuit and producing a DC control signal; and a voltage control oscillator receiving as a control signal said DC control signal from said loop filter and producing said clock signals applied to said clock input terminals of said phase comparator circuit.

6. A phase locked loop (PLL) circuit according to claim 5, in which said loop filter is a low pass filter.

* * * * *